(12) United States Patent
Kim

(10) Patent No.: US 12,433,046 B2
(45) Date of Patent: Sep. 30, 2025

(54) IMAGE SENSING DEVICE

(71) Applicant: SK hynix Inc., Icheon-si (KR)

(72) Inventor: Jong Eun Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 725 days.

(21) Appl. No.: 17/524,489

(22) Filed: Nov. 11, 2021

(65) Prior Publication Data

US 2022/0310681 A1  Sep. 29, 2022

(30) Foreign Application Priority Data

Mar. 24, 2021  (KR) .......................... 10-2021-0038196

(51) Int. Cl.
*H10F 39/00* (2025.01)
(52) U.S. Cl.
CPC ....... *H10F 39/802* (2025.01); *H10F 39/8033* (2025.01)
(58) Field of Classification Search
None
See application file for complete search history.

(56) References Cited

U.S. PATENT DOCUMENTS

2016/0049429 A1* 2/2016 Lee ................. H10F 39/1865
 257/231
2016/0056199 A1* 2/2016 Kim ................. H10F 39/18
 257/233

FOREIGN PATENT DOCUMENTS

| CN | 111415953 A | 7/2020 |
| JP | 2011159757 A | 8/2011 |
| JP | 2012084610 A | 4/2012 |
| KR | 20130007121 A | 1/2013 |
| KR | 20210011491 A | 2/2021 |

\* cited by examiner

*Primary Examiner* — Nilufa Rahim
(74) *Attorney, Agent, or Firm* — Perkins Coie LLP

(57) ABSTRACT

An image sensing device includes a first photoelectric conversion region structured to generate photocharges based on incident light, a first photogate disposed over the first photoelectric conversion region to collect photocharges generated by the first photoelectric conversion region, a first transfer gate disposed at one side of the first photogate to transmit the photocharges collected by the first photogate to a first floating diffusion region, a first photogate contact coupled to a first region of the first photogate, and a second photogate contact coupled to a second region of the first photogate that is located closer to the first transfer gate than the first region in the first photogate. The second region is more deeply etched than the first region.

19 Claims, 21 Drawing Sheets

IMAGE SENSING DEVICE

CROSS-REFERENCE TO RELATED APPLICATION

This patent document claims the priority and benefits of Korean patent application No. 10-2021-0038196, filed on Mar. 24, 2021, which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various devices such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, a CMOS fabrication technology can be used to incorporate photosensitive elements and other signal processing circuitry into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device that can improve transfer efficiency of photocharges generated by incident light.

In accordance with an embodiment of the disclosed technology, an image sensing device includes a first photoelectric conversion region structured to generate photocharges based on incident light, a first photogate disposed over the first photoelectric conversion region to collect photocharges generated by the first photoelectric conversion region, a first transfer gate disposed at one side of the first photogate to transmit the photocharges collected by the first photogate to a first floating diffusion region, a first photogate contact coupled to a first region of the first photogate, and a second photogate contact coupled to a second region of the first photogate that is located closer to the first transfer gate than the first region in the first photogate. In some implementations, the second region is more deeply etched than the first region. In some implementations, wherein the first photogate is formed by performing a first etching operation in one portion that is connected to the second photogate contact and a second etching operation in another portion that is connected to the first photogate contact such that the first operation results in a greater degree of etching than the second etching operation.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and the disclosed features may be implemented to achieve one or more advantages in more applications. The disclosed technology can be implemented in some embodiments to provide an image sensing device with an improved photocharge transfer efficiency.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
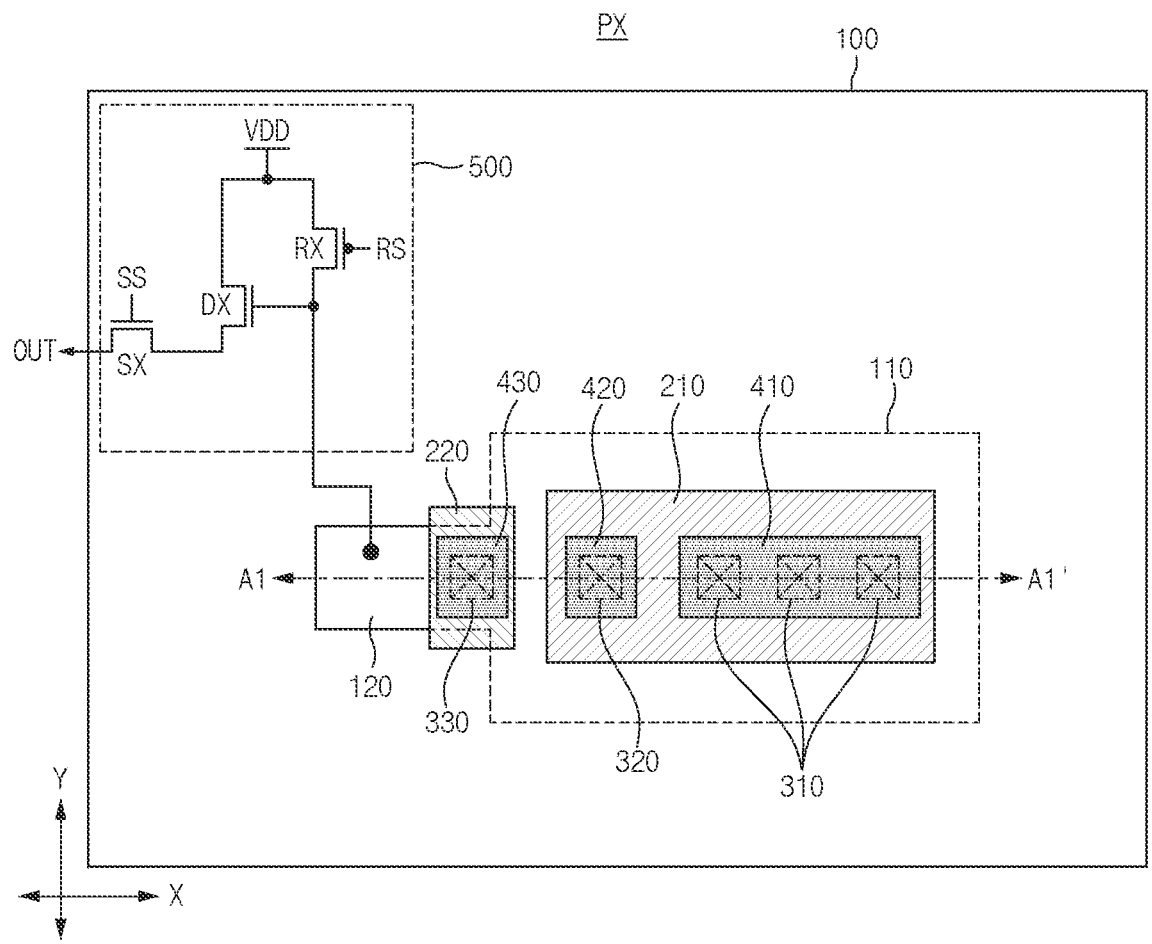
FIG. 1 is a plan view illustrating an example of a unit pixel included in an image sensing device based on some implementations of the disclosed technology.
Figure 2:
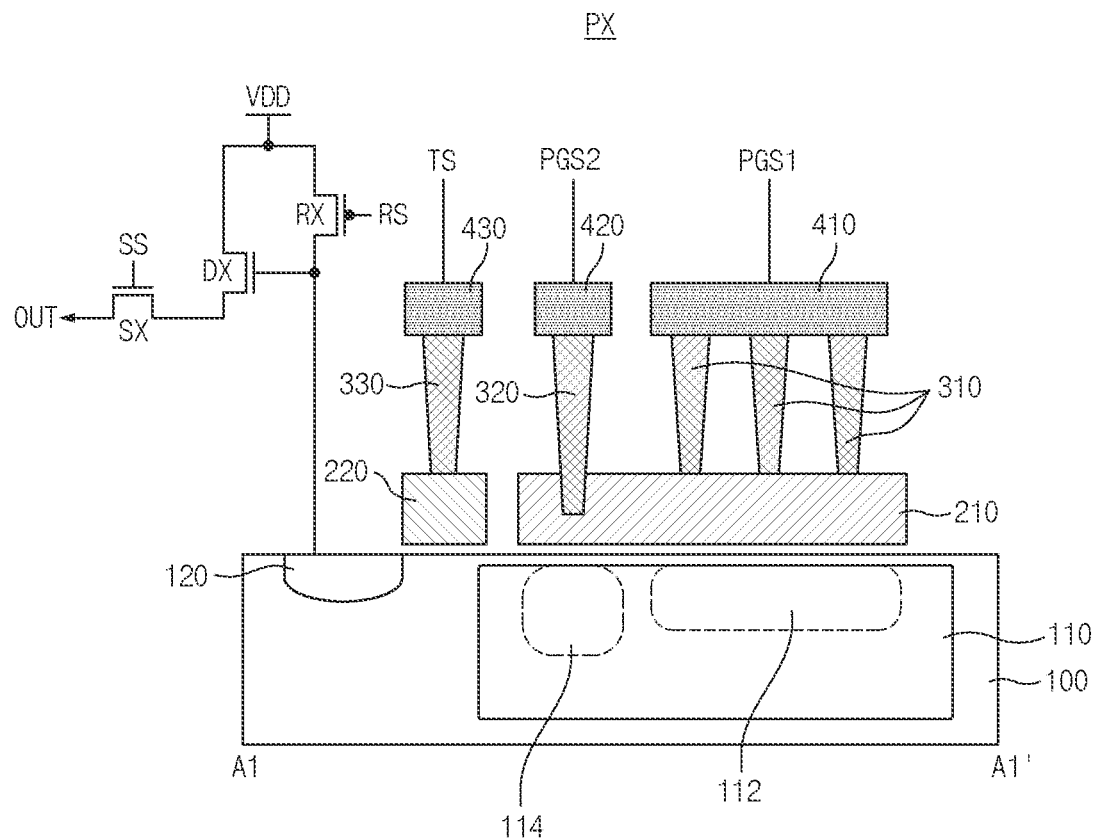
FIG. 2 is a cross-sectional view illustrating an example of the unit pixel taken along the line A1-A1' shown in FIG. 1 based on an embodiment of the disclosed technology.

FIG. 1 is a plan view illustrating an example of a unit pixel (PX) included in an image sensing device based on some implementations of the disclosed technology. FIG. 2 is a cross-sectional view illustrating an example of the unit pixel (PX) taken along the line A1-A1' shown in FIG. 1.

Referring to FIGS. 1 and 2, the unit pixel (PX) may include a photoelectric conversion region 110, a floating diffusion region 120, a photogate 210, a transfer gate 220, a plurality of first photogate contacts 310, at least one second photogate contact 320, and a readout circuit 500. Here, the first and second photogate contacts 310 and 320 may include a contact plug or any type of metal or conductor component structured to electrically connect the photogate 210 to different layers. In some implementations, the at least one second photogate contract 320 can be formed by performing an over-etching process, and the first photogate contacts 310 can be formed without performing the over-etching process. In this patent document, etching process and over-etching process can include any technology that selectively removes material from a substrate or a structure on the substrate. The over-etching process can include any etching process that results in a greater degree of etching than a normal etching operation. The degree of etching can depend on many factors, such as etching time, material type, thickness of mask pattern, etchant, and ion energy.

The photoelectric conversion region 110 may be formed in a semiconductor substrate 100, and may generate photocharges based on incident light. The photoelectric conversion region 110 may include a photodiode, a photo transistor, a pinned photodiode, or a combination thereof.

In some implementations, the floating diffusion region 120 may be formed in an upper portion of the semiconductor substrate 100. In one example, the floating diffusion region 120 can be in contact with a top surface of the semiconductor substrate 100. Photocharges that are generated by the photoelectric conversion region 110 are transferred by the transfer gate 220 and accumulated at the floating diffusion region 120. In some implementations, a bottom surface of the semiconductor substrate 100, which is the opposite surface of the top surface, is structured to receive incident light. The floating diffusion region 120 may include N-type ($N^+$) impurities at a high doping concentration. The floating diffusion region 120 may be coupled to the readout circuit 500.

The photogate 210 may be formed over the semiconductor substrate 100 to vertically overlap with the photoelectric conversion region 110. The photogate 210 may be formed in a rectangular shape such that its length in a first direction (e.g., X-axis direction) is longer than it length in a second direction (e.g., Y-axis direction). An insulation layer (e.g., a gate oxide layer) may be formed between the photogate 210 and the semiconductor substrate 100, and the photogate 210 may be coupled to the second photogate contact 320 and the first photogate contacts 310. In some implementations, the photogate 210 may be formed by performing a first etching process in one portion and a second etching process in another portion such that the first etching process results in a greater degree of etching than the second etching process. In one example, a portion of the photogate 210 that is connected to the second photogate contact 320 is formed by the first etching process, and another portion that is connected to the first photogate contacts 310 is formed by the second etching process. In other implementations, the photogate 210 may be formed by performing an over-etching process in one portion and a normal etching process in another portion. In one example, a portion of the photogate 210 that is connected to the second photogate contact 320 is formed by the over-etching process, and another portion that is connected to the first photogate contacts 310 is formed by the normal etching process.

The photogate 210 may receive different control signals (e.g., photogate control signals) PGS1 and PGS2 through the first photogate contacts 310 and the second photogate contact 320. The photogate 210 may collect photocharges based on the control signals (e.g., photogate control signals) PGS1 and PGS2, and may allow the collected photocharges to move to a region adjacent to the transfer gate 220. For example, the photogate 210 may collect photocharges generated by the photoelectric conversion region 110 in a first charge collection region 112 based on a photogate control signal PGS1 received through the first photogate contacts 310, and may allow the photocharges collected in the first charge collection region 112 to move to a second charge collection region 114 based on a photogate control signal PGS2 received through the second photogate contacts 320.

The photogate 210 may include polysilicon or transparent conducting oxide (TCO). For example, the photogate 210 may include transparent conducting oxide (TCO), for example, Indium Tin Oxide (ITO), Indium Zinc Oxide (IZO), Zinc Oxide (ZnO), titanium dioxide ($TiO_2$), or a combination thereof.

The transfer gate 220 may be disposed adjacent to the photogate 210 in a first direction over the semiconductor substrate 100. An insulation layer (e.g., a gate oxide layer) may be formed between the transfer gate 220 and the semiconductor substrate 100. The transfer gate 220 may be controlled by a transfer control signal (TS). The transfer gate 220 may receive the transfer control signal (TS) by connecting to a conductive line 430 through a transfer gate contact 330. The transfer gate 220 may transmit the photocharges collected by the photogate 210 to the floating diffusion region 120 based on the transfer control signal (TS).

The first photogate contacts 310 may electrically couple a conductive line 410 to the photogate 210 to apply the photogate control signal PGS1 to a first region of the photogate 210. The second photogate contact 320 may electrically couple the conductive line 420 to the photogate 210 to apply the other photogate control signal PGS2 to a second region of the photogate 210. In some implementations, the second region may be located closer to the transfer gate 220 than the first region. Here, the first region may be formed to overlap with the first charge collection region 112 in the photogate 210, and the second region may overlap with the second charge collection region 114 in the photogate 210. In some implementations, the first photogate contacts 310 and the second photogate contact 320 are isolated from each other, and the first photogate contacts 310 are coupled to the conductive line 410 and the second photogate contact 320 is coupled to the conductive line 420. As a result, different photogate control signals PGS1 and PGS2 can be sequentially applied to different regions (i.e., first region and second region) of the photogate 210.

The first photogate contacts 310 and the second photogate contact 320 may be arranged in a row in the first direction. In some implementations, the second photogate contact 320 may be located closer to the transfer gate 220 than the first photogate contacts 310.

In some implementations, a lower region of the second photogate contact 320 may be formed at a deeper depth in the photogate 210 than lower regions of the first photogate contacts 310. For example, in the photogate 210, a portion that is connected to the second photogate contact 320 may be formed by performing an over-etching process that results in a greater degree of etching than a portion connected to the first photogate contacts 310, so that a bottom surface of the second photogate contact 320 can be located closer to the semiconductor substrate 100 than bottom surfaces of the first photogate contacts 310. As described above, the second photogate contact 320 may be formed to a deeper depth in the photogate 210 than the first photogate contact 310, thereby increasing the intensity of an electric field generated by the photogate control signal PGS2 within the photoelectric conversion region 110.

As described above, in some implementations where the contacts 310 and the contact 320 are coupled to the photogate 210, the contact 320, which is located closer to the transfer gate 220, may be isolated from the other contacts 310, such that the contact 320 and the other contacts 310 may receive different photogate control signals. In addition, a bottom surface of the contact 320 may be located closer to the semiconductor substrate 100 than bottom surfaces of the contacts 310. The image sensing device based on some implementations of the disclosed technology can enable photocharges generated by the photoelectric conversion region 110 to be collected near the transfer gate 220, thereby increasing the photocharge transfer efficiency in each pixel.

The readout circuit 500 may output a pixel signal corresponding to photocharges accumulated in the floating diffusion region 120. The readout circuit 500 may include a reset transistor RX, a source follower transistor DX, and a selection transistor SX. Source/drain regions of the reset transistor RX may be coupled to a power-supply voltage node (VDD) and the floating diffusion region 120, so that the reset transistor RX can initialize the floating diffusion region 120 based on a reset signal (RS) applied to a gate electrode thereof. Source/drain regions of the source follower transistor DX may be coupled to the power-supply voltage node VDD and the selection transistor SX, and a gate electrode thereof is coupled to the floating diffusion region 120. The source follower transistor DX may generate a pixel signal corresponding to a voltage value generated by photocharges accumulated in the floating diffusion region 120. Source/drain regions of the selection transistor SX may be coupled to the source follower transistor DX and an output node (OUT), so that the selection transistor SX can output a pixel signal generated from the source follower transistor DX to the output node (OUT) based on a selection signal (SS) applied to a gate electrode thereof.

Figure 3A:
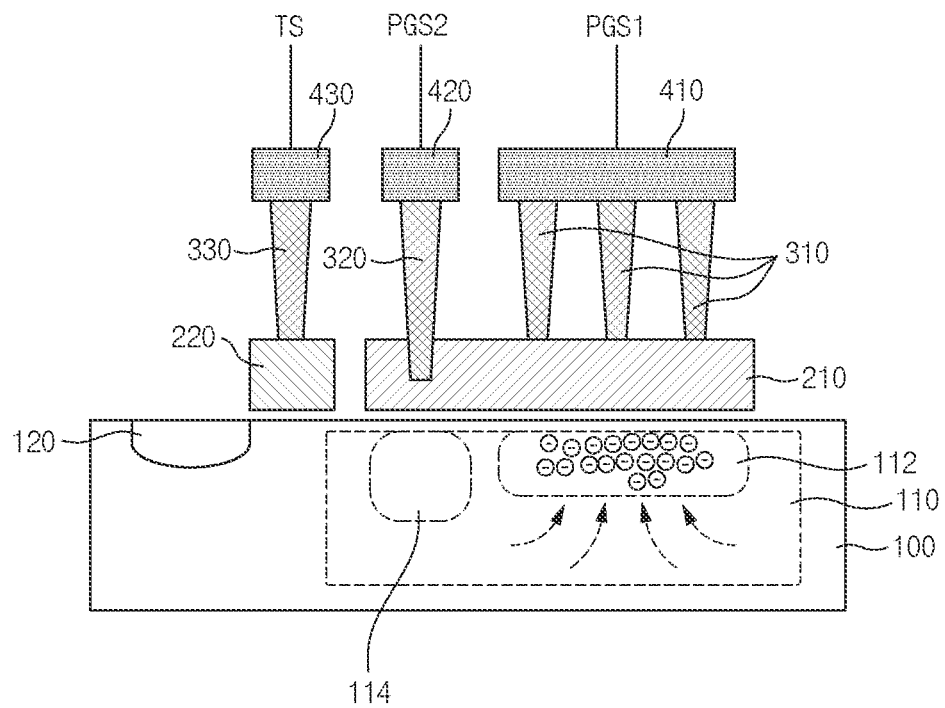
FIGS. 3A to 3C illustrate examples of how photocharges are collected and move in the unit pixel shown in FIGS. 1 and 2.
Figure 3B:
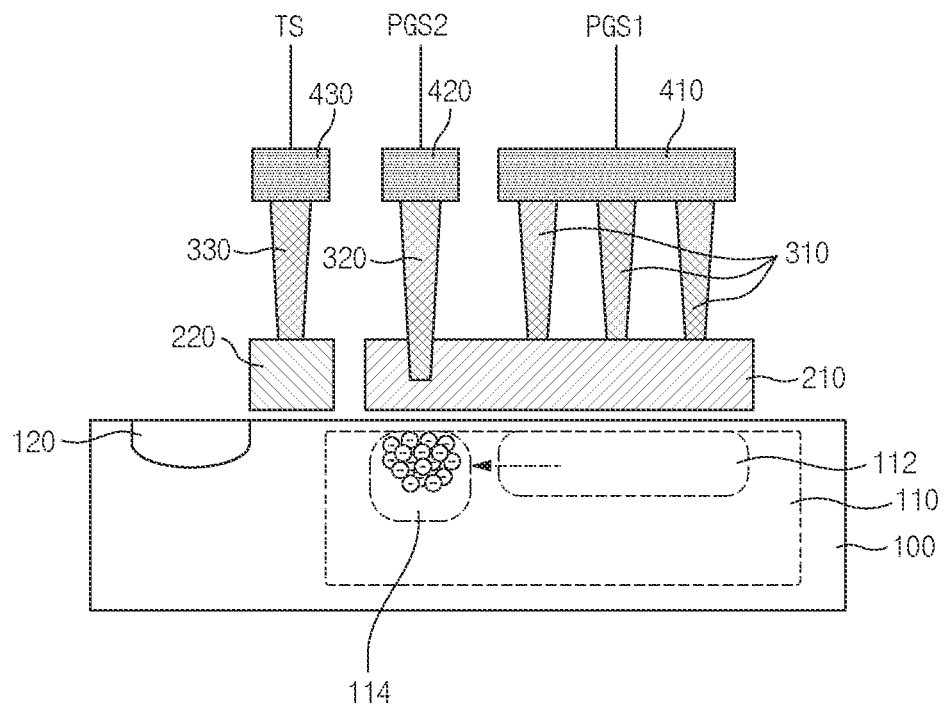
Figure 3C:
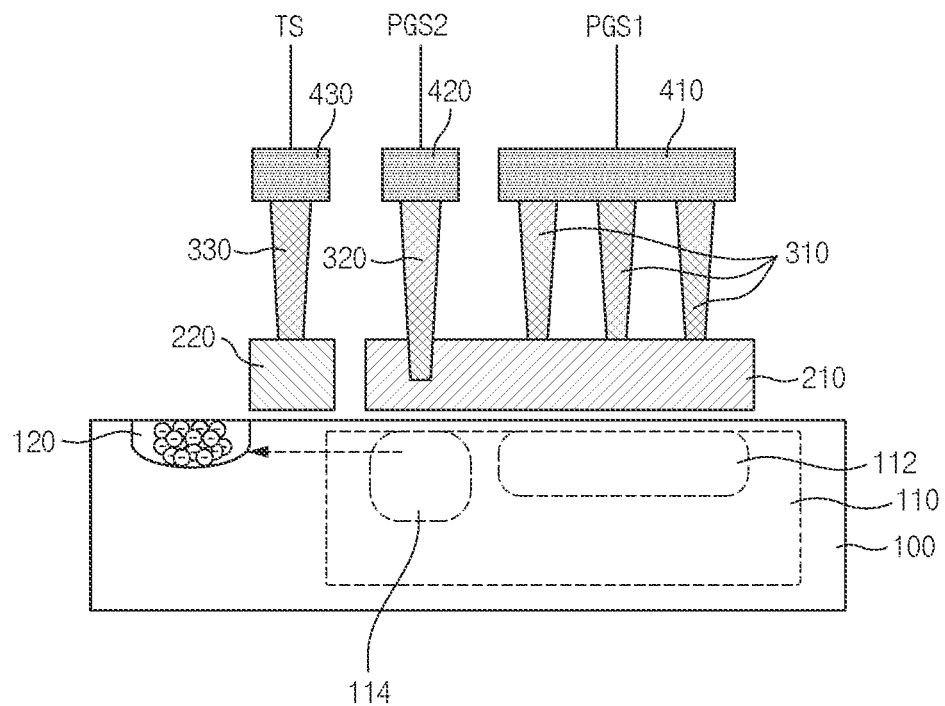
Figure 4:
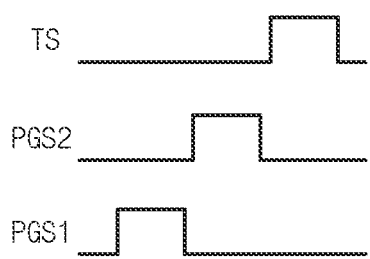
FIG. 4 is a timing diagram illustrating an example of control signals applied through photogate contacts and a transfer gate contact.

FIGS. 3A to 3C illustrate examples of how photocharges are collected and move in the unit pixel shown in FIGS. 1 and 2. FIG. 4 is a timing diagram illustrating an example of control signals applied through photogate contacts and a transfer gate contact.

Referring to FIGS. 3A and 4, light incident upon the semiconductor substrate 100 may be converted into photocharges by the photoelectric conversion region 110. When the photogate control signal PGS1 having a high level is applied to the first region of the photogate 210 through the conductive line 410 and the first photogate contacts 310, the photocharges generated by the photoelectric conversion region 110 may be collected in the first charge collection region 112 by an electric field generated by the photogate control signal PGS1.

Subsequently, referring to FIGS. 3B and 4, when the photogate control signal PGS1 transitions to a low level and the other photogate control signal PGS2 having a high level is then applied to the second region of the photogate 210 through the conductive line 420 and the second photogate contact 320, photocharges collected in the first charge collection region 112 may move to the second charge collection region 114 by an electric field generated by the photogate control signal PGS2. In this case, since the second photogate contact 320 is located closer to the semiconductor substrate 100, the intensity of an electric field formed in the semiconductor substrate 100 may be at a relatively higher level by the photogate control signal PGS2, facilitating photocharges collected in the first charge collection region 112 to move to the second charge collection region 114.

Although FIG. 4 illustrates the photogate control signals PGS1 and PGS2 as having the same logic levels (e.g., logic high or logic low), it should be noted that high levels of the photogate control signals PGS1 and PGS2 may be different from each other. For example, a high level of the photogate control signal PGS2 can be greater than a high level of the photogate control signal PGS1. In addition, after the photogate control signal PGS1 has transitioned to a low level, the photogate control signal PGS2 may be activated to a high level. Alternatively, as soon as the photogate control signal PGS1 transitions to a low level, the photogate control signal PGS2 may also be activated to a high level.

Referring to FIGS. 3C and 4, when the photogate control signal PGS2 transitions to a low level and a transfer control signal TS having a high level is applied to the transfer gate 220 through the conductive line 430 and the transfer gate contact 330, a channel may be formed below the transfer gate 220, so that the photocharges collected in the second charge collection region 114 can move to the floating diffusion region 120.

In this case, the transfer control signal TS applied to the transfer gate 220 may have a higher level than the photogate control signal PGS2. In addition, after the photogate control signal PGS2 has transitioned to a low level, the transfer control signal TS can be applied at a high level. Alternatively, as soon as the photogate control signal PGS2 transitions to a low level, the transfer control signal TS can be applied at a high level.

FIGS. 5A to 5D illustrate example methods for forming contacts 310 and 320 based on an embodiment of the disclosed technology.

Figure 5A:
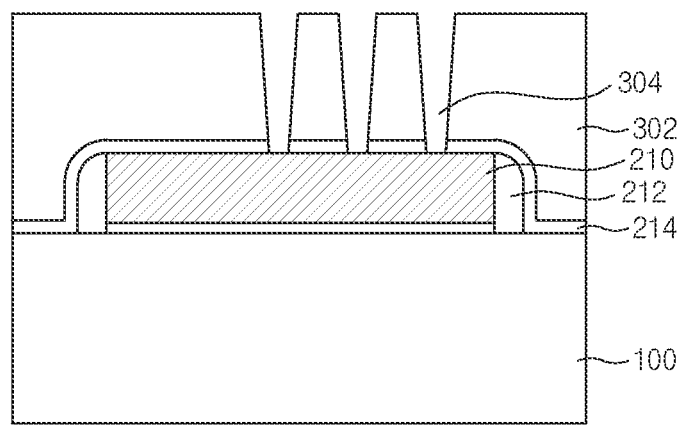
FIGS. 5A to 5D illustrate example methods for forming contacts based on an embodiment of the disclosed technology.

Referring to FIG. 5A, the photogate 210 may be formed over the semiconductor substrate 100, and a gate spacer 212 may be formed on a side surface of the photogate 210. Subsequently, a cell spacer 214 may be formed to cover the semiconductor substrate 100, the photogate 210, and the gate spacer 212.

Subsequently, an interlayer insulation layer 302 may be formed over the cell spacer 214, and a first mask pattern (not shown) for defining a region to be used as a formation region of the first photogate contacts 310 may be formed over the interlayer insulation layer 302. Then, the interlayer insulation layer 302 may be etched until a top surface of the photogate 210 is exposed using the first mask pattern as an etch mask, resulting in formation of a plurality of recesses 304.

Figure 5B:
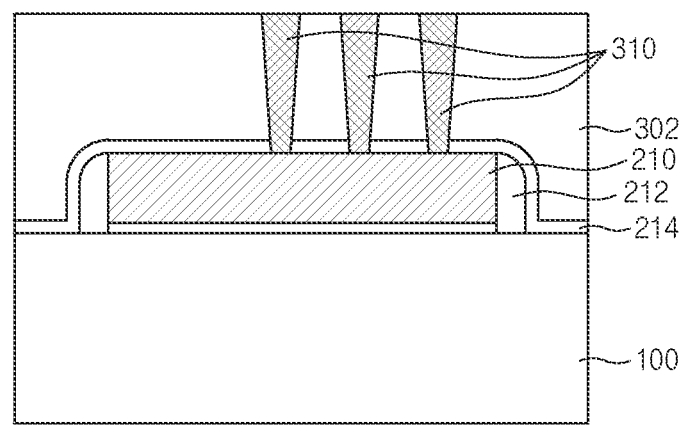

Referring to FIG. 5B, the first photogate contacts 310 may be formed by filling the recesses 304 with conductive materials.

Figure 5C:
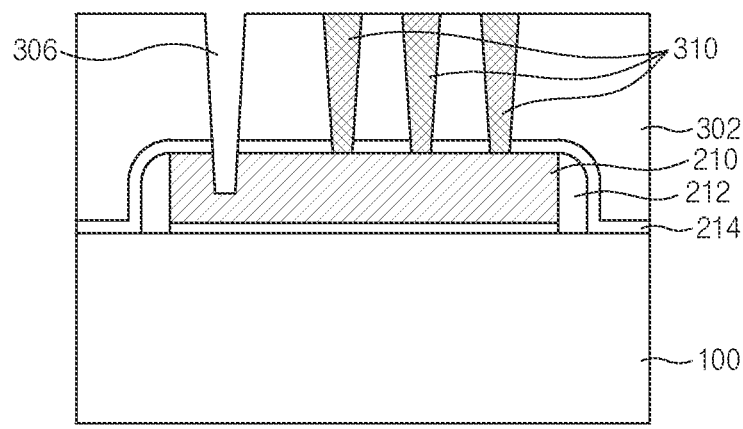

Referring to FIG. 5C, a second mask pattern (not shown) for defining a region to be used as a formation region of the second photogate contacts 320 may be formed over the interlayer insulation layer 302 in which the first photogate contacts 310 are formed.

Subsequently, the photogate 210 may be etched using the second mask pattern as an etch mask, resulting in formation of a recess 306. In this case, the recess 306 shown in FIG. 5C may be more deeply over-etched than each of the recesses 304 shown in FIG. 5A.

Figure 5D:
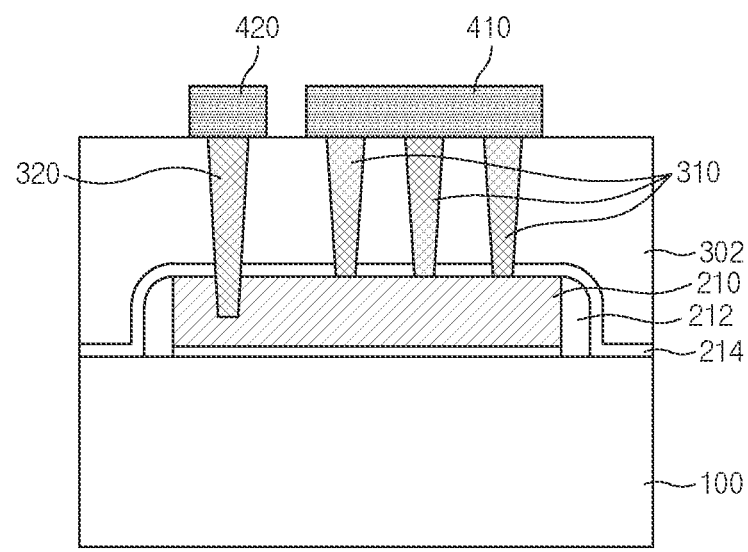

Referring to FIG. 5D, the recess 306 may be filled with conductive materials, resulting in formation of the second photogate contact 320.

Subsequently, after a conductive layer is formed over the interlayer insulation layer 302 so as to be coupled to the first photogate contacts 310 and the second photogate contact 320, the conductive layer is patterned, resulting in formation of conductive lines 410 and 420.

Figure 6A:
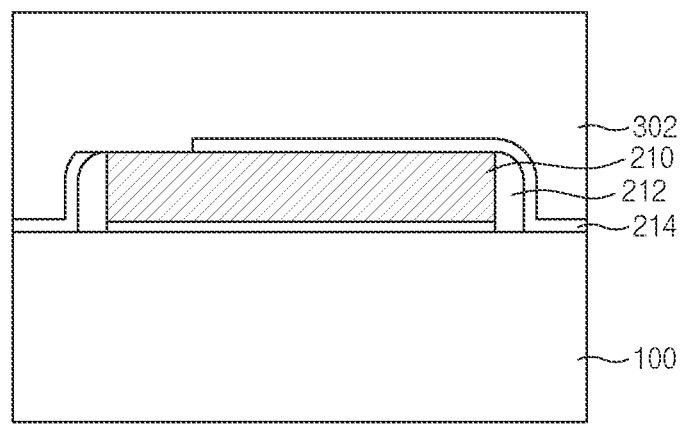
FIGS. 6A to 6C illustrate example methods for forming contacts based on another embodiment of the disclosed technology.
Figure 6B:
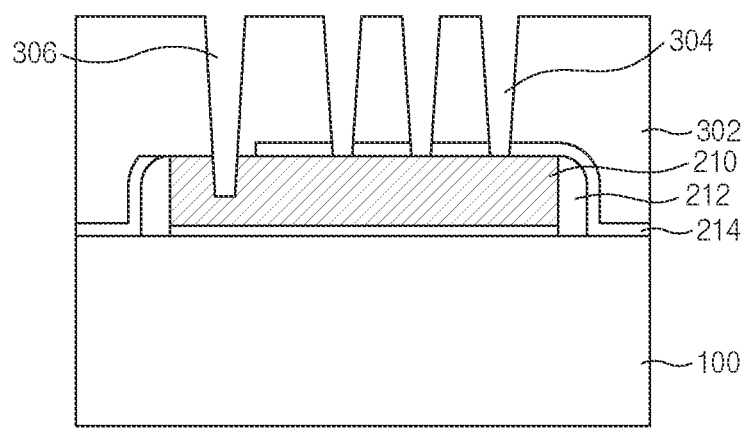
Figure 6C:
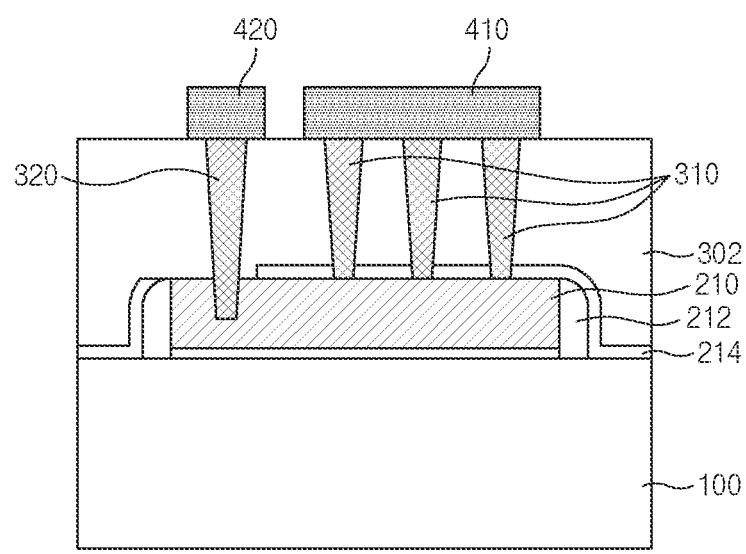

FIGS. 6A to 6C illustrate example methods for forming contacts 310 and 320 based on another embodiment of the disclosed technology.

Referring to FIG. 6A, the photogate 210 may be formed over the semiconductor substrate 100, and a gate spacer 212 may be formed on a side surface of the photogate 210. Subsequently, a cell spacer 214 may be formed to cover the semiconductor substrate 100, the photogate 210, and the gate spacer 212.

The cell spacer 214 to be used as a formation region of the second photogate contact 320 may be partially removed. An interlayer insulation layer 302 may be formed over the cell spacer 214 and the photogate 210 from which the cell spacer 214 is removed.

Referring to FIG. 6B, a mask pattern for defining a formation region of the second photogate contact 320 and a formation region of the first photogate contacts 310 may be formed over the interlayer insulation layer 302. The interlayer insulation layer 302 may be etched using the mask pattern as an etch mask, forming recesses or contact holes 304 and 306. Because the cell spacer 214 exists in a region where the recesses 304 are formed and the cell spacer 214 does not exist in a region where the recess 306 is formed, the recesses 304 and 306 may have different depths even if the same etching process is performed thereon. In other words, the recess 306 may have a greater depth than each of the recesses 304.

Referring to FIG. 6C, the recesses or contact holes 304 and 306 are filled with conductive materials. In this way, the first photogate contacts 310 and the second photogate contact 320 can be formed.

Subsequently, after a conductive layer is formed over the interlayer insulation layer 302 to be coupled to the first photogate contacts 310 and the overetch photogate contact 320, the conductive layer may be patterned to form conductive lines 410 and 420.

Figure 7A:
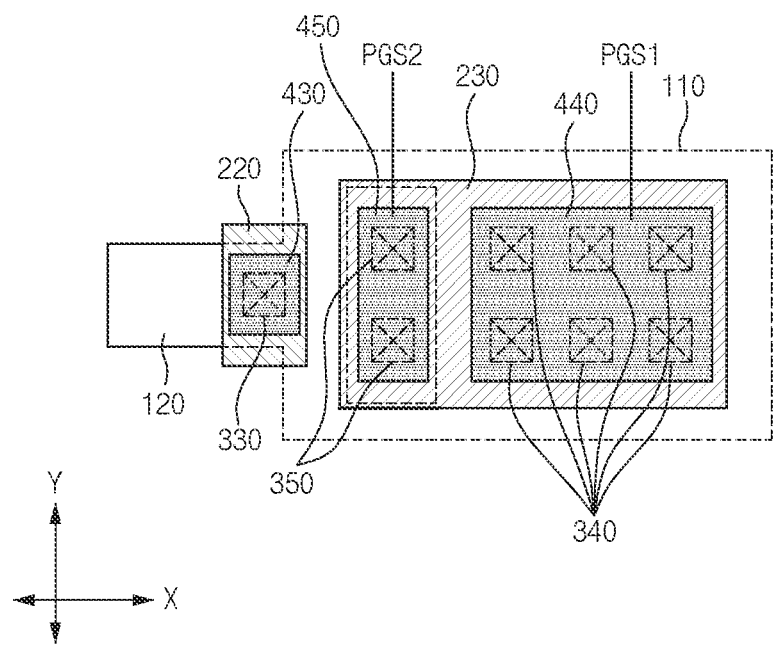
FIGS. 7A to 7C are plan views illustrating example structures of unit pixels based on another embodiment of the disclosed technology.
Figure 7B:
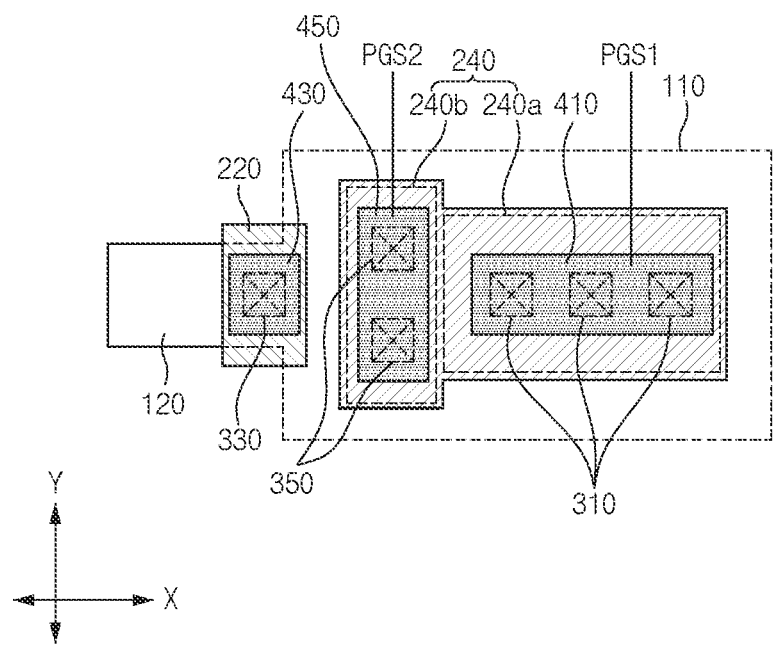
Figure 7C:
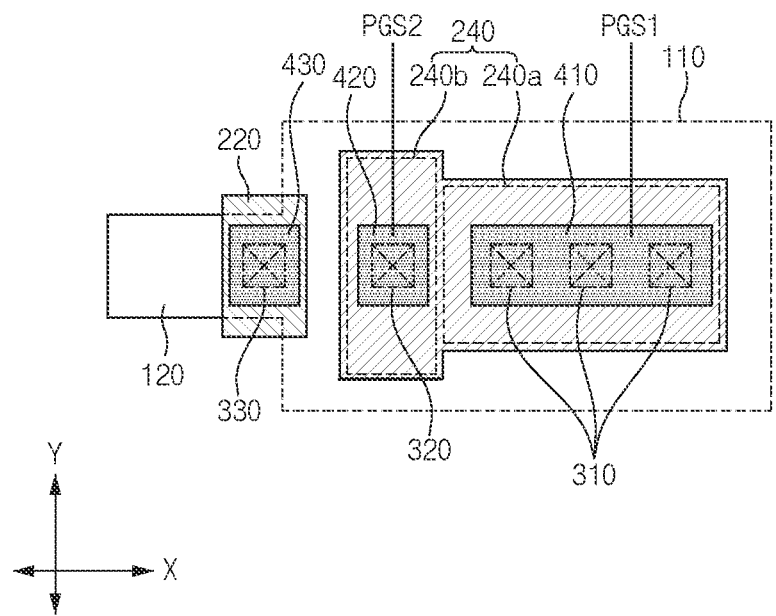

FIGS. 7A to 7C are plan views illustrating example structures of unit pixels based on another embodiment of the disclosed technology.

Referring to FIG. 7A, first photogate contacts 340 and second photogate contacts 350 may be arranged in a first direction (e.g., X-axis direction). In this case, two second photogate contacts 350 may be arranged in a second direction (e.g., Y-axis direction), and a plurality of pairs of the first photogate contacts 340 may be arranged at a certain interval in a first direction such that each pair of the first photogate contacts 340 is arranged in a second direction (e.g., Y-axis direction). In some implementations, as can be seen from FIG. 7A, two second photogate contacts 350 are arranged in one column (e.g., second direction), and six (three pairs) first photogate contacts 340 are arranged in three columns. In this case, the photogate 230 may be larger in width than the photogate 210 shown in FIG. 2. In some implementations, the second-directional width (i.e., Y-axis directional length) of the photogate 230 shown in FIG. 7A may be larger than that of the photogate 210 shown in FIG. 1.

The first photogate contacts 340 may be coupled to a conductive line 440 in common, and the second photogate contacts 350 may be commonly coupled to a conductive line 450.

Referring to FIG. 7B, a photogate 240 may include a first region 240a and a second region 240b. The first photogate contacts 310 may be arranged in the first direction in the first region 240a as shown in FIG. 1. Two second photogate contacts 350 may be arranged in the second direction in the second region 240b as shown in FIG. 7A. The second region 240b is connected to the second photogate contacts 350 and is larger in width than the first region 240a connected to the first photogate contacts 310. In some implementations, each of the first region 240a and the second region 240b may be formed in a rectangular shape. In one example, a width of the first region 240a in the first direction is longer than a width of the first region 240a in the second direction, and a width of the second region 240b in the second direction is longer than a width of the second region 240b in the first direction.

Referring to FIG. 7C, the photogate 240 may include a first region 240a and a second region 240b, and the first photogate contacts 310 are arranged in the first region 240a and the second photogate contact 320 is arranged in the second region 240b. The first photogate contacts 310 and the second photogate contact 320 may be arranged in a row in the first direction as shown in FIG. 1. As can be seen from FIG. 7C, the second region 240b, in which the second photogate contact 320 are formed, has a larger width than the first region 240a, in which the first photogate contacts 310 are formed.

Figure 8:
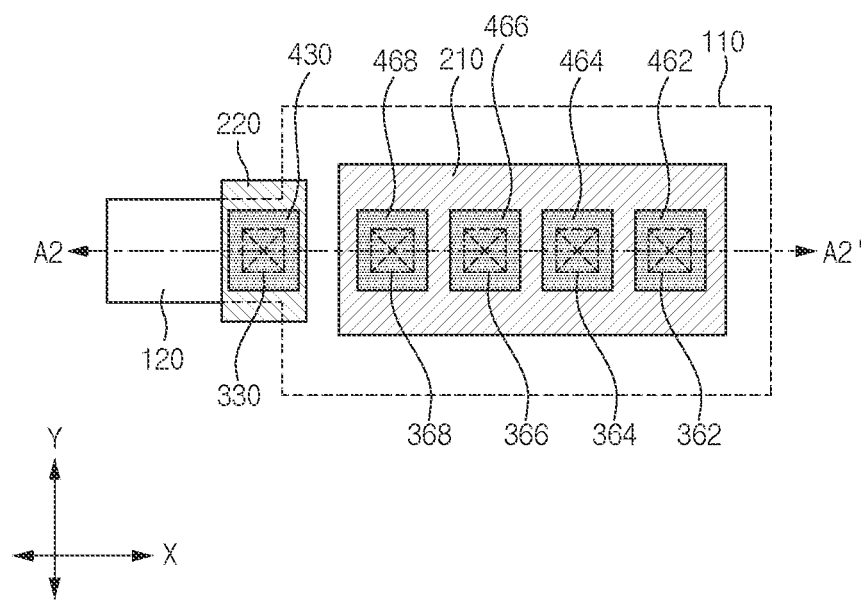
FIG. 8 is a plan view illustrating an example of a unit pixel included in an image sensing device based on another embodiment of the disclosed technology.
Figure 9:
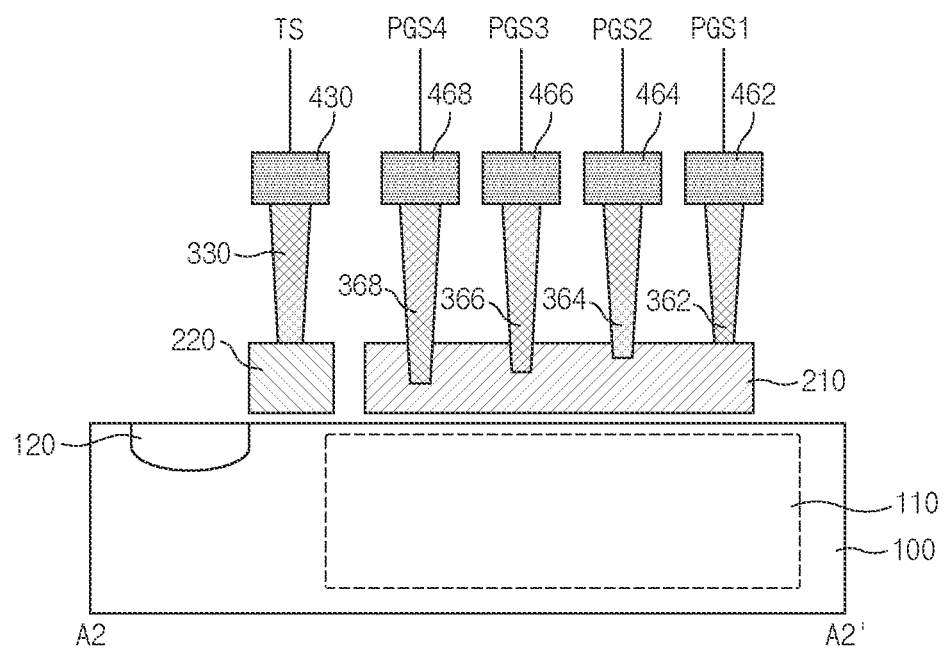
FIG. 9 is a cross-sectional view illustrating an example of the unit pixel taken along the line A2-A2' shown in FIG. 8 based on another embodiment of the disclosed technology.

FIG. 8 is a plan view illustrating an example of a unit pixel included in an image sensing device based on another embodiment of the disclosed technology. FIG. 9 is a cross-sectional view illustrating an example of the unit pixel taken along the line A2-A2' shown in FIG. 8 based on another embodiment of the disclosed technology.

Referring to FIGS. 8 and 9, photogate contacts 362, 364, 366, and 368 connected to the photogate 210 may be respectively coupled to conductive lines 462, 464, 466, and 468, so that the photogate contacts 362, 364, 366, and 368 can receive photogate control signals PGS1, PGS2, PGS3, and PGS4, respectively. For example, the photogate contact 362 may receive the photogate control signal PGS1 by connecting to the conductive line 462, and the photogate contact 364 may receive the photogate control signal PGS2 by connecting to the conductive line 464. In addition, the photogate contact 366 may receive the photogate control signal PGS3 by connecting to the conductive line 466, and the photogate contact 368 may receive the photogate control signal PGS4 by connecting to the conductive line 468.

The photogate contacts 362, 364, 366, and 368 may be arranged in a row in the first direction (X-axis direction). The closer to the transfer gate 220 the photogate contacts 362, 364, 366, and 368 are located, the deeper the bottom ends of the photogate contacts 362, 364, 366, and 368 are located in the photogate 210. In some implementations, as can be seen from FIG. 9, the photogate contact 368 located closest to the transfer gate 220 has the greatest depth in the photogate 210, and the photogate contact 362 located farthest from the transfer gate 220 has the smallest depth in the photogate 210.

Figure 10:
FIG. 10 is a timing diagram illustrating an example of control signals applied to photogate contacts and a transfer gate contact.

The photogate control signals PGS1, PGS2, PGS3, and PGS4 may sequentially be applied to the photogate contacts 362, 364, 366 and 368 in the order of the distance of the photogate contacts 362, 364, 366, 368 from the transfer gate 220, as can be seen from FIGS. 9 and 10. For example, the photogate control signal PGS1 having a high level is applied to the photogate contact 362. Subsequently, when or after the photogate control signal PGS1 transitions to a low level, the photogate control signal PGS2 having a high level may be applied to the photogate contact 364. Then, when or after the photogate control signal PGS2 transitions to a low level, the photogate control signal PGS3 having a high level may be applied to the photogate contact 366. Finally, when or after the photogate control signal PGS3 transitions to a low level, the photogate control signal PGS4 having a high level may be applied to the photogate contact 368. In this case, in order to collect photocharges in a region near the transfer gate 220, the photogate control signal PGS4 applied to the photogate contact 368 located closest to the transfer gate 220 may stay at a high level for a longer period than the other photogate control signals PGS1-PGS3.

When or after the photogate control signal PGS4 transitions to a low level, the transfer control signal TS may be applied at a high level, so that photocharges can move to the floating diffusion region 120.

Figure 11:
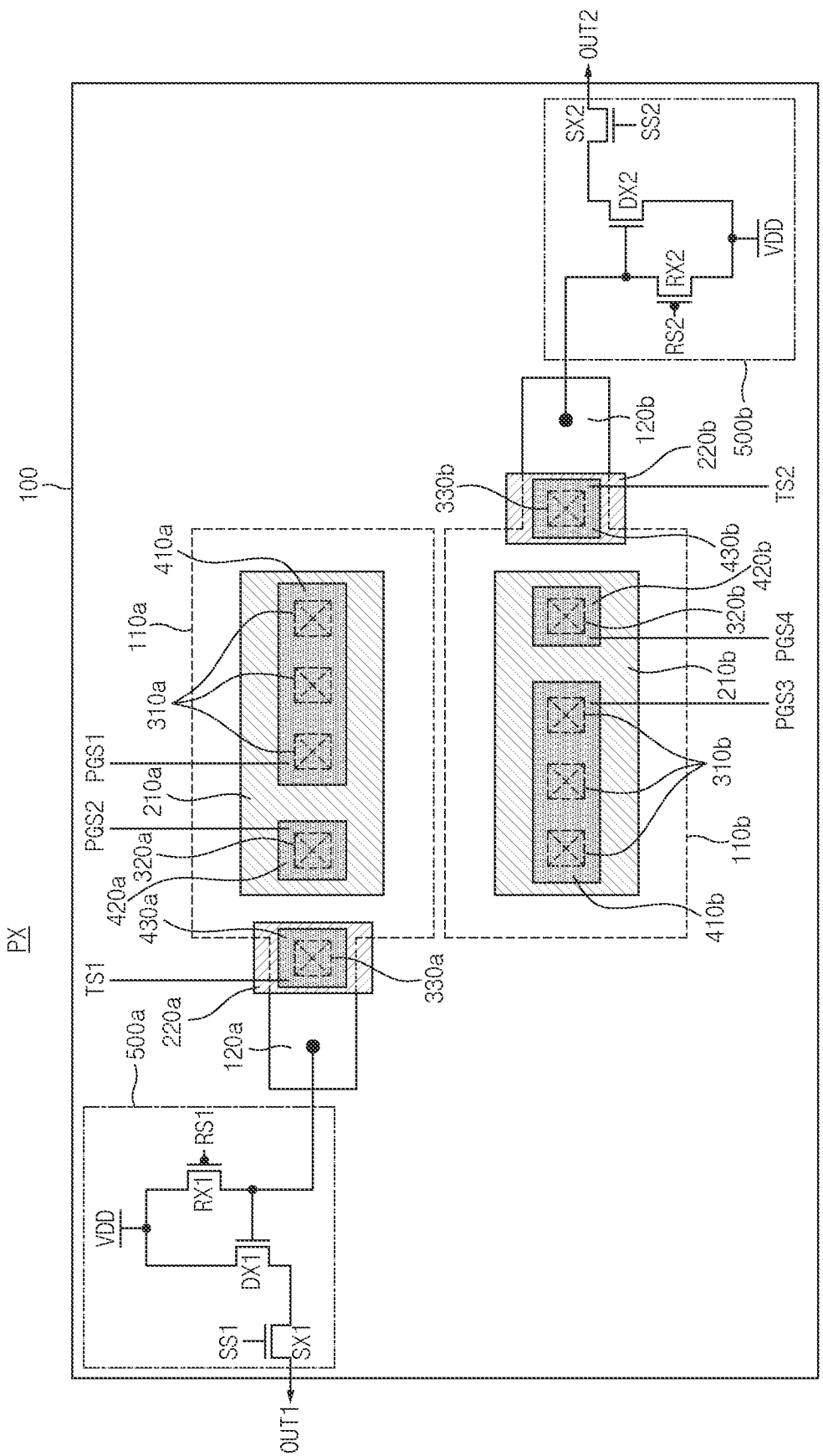
FIG. 11 is a schematic diagram illustrating an example structure of a unit pixel included in an image sensing device based on another embodiment of the disclosed technology.

FIG. 11 is a schematic diagram illustrating an example structure of a unit pixel (PX) included in an image sensing device based on another embodiment of the disclosed technology.

Referring to FIG. 11, the unit pixel (PX) may include a first photoelectric conversion region 110a, a second photoelectric conversion region 110b, a first floating diffusion region 120a, a second floating diffusion region 120b, a first photogate 210a, a second photogate 210b, a first transfer gate 220a, a second transfer gate 220b, a plurality of third photogate contacts 310a, a plurality of fourth photogate contacts 310b, at least one fifth photogate contact 320a, at least one sixth photogate contact 320b, a first readout circuit 500a, and a second readout circuit 500b. In some implementations, the at least one fifth photogate contact 320a and the at least one sixth photogate contact 320b can be formed by performing an over-etching process, and the third and fourth photogate contacts 310a and 310b can be formed without performing the over-etching process.

The first photoelectric conversion region 110a and the second photoelectric conversion region 110b may be formed in the semiconductor substrate 100, and may generate photocharges by converting incident light into electrons and holes.

The first floating diffusion region 120a may be used to hold or store photocharges transferred by the first transfer gate 220a. For example, photocharges collected by the first photogate 210a move through the first transfer gate 220a to the first floating diffusion region 120a, and the photocharges are accumulated at the first floating diffusion region 120a. The first floating diffusion region 120a may be coupled to the first readout circuit 500a.

The second floating diffusion region 120b may be used to hold or store photocharges transferred by the second transfer gate 220b. For example, photocharges collected by the second photogate 210b move through the second transfer gate 220b to the second floating diffusion region 120b, and the photocharges are accumulated at the second floating diffusion region 120b. The second floating diffusion region 120b may be coupled to the second readout circuit 500b.

Each of the first floating diffusion region 120a and the second floating diffusion region 120b may include N-type (N$^+$) impurities at a high doping concentration. The first floating diffusion region 120a and the second floating diffusion region 120b may be located opposite to each other with respect to the photoelectric conversion regions 110a and 110b.

The first photogate 210a may be formed over the semiconductor substrate 100 to vertically overlap with the first photoelectric conversion region 110a, and the second photogate 210b may be formed over the semiconductor substrate 100 to vertically overlap with the second photoelectric conversion region 110b. Each of the first photogate 210a and the second photogate 210b may be formed in a line shape extending in the first direction (e.g., X-axis direction), and the first photogate 210a and the second photogate 210b may be disposed adjacent to each other in the second direction (e.g., Y-axis direction).

The first photogate 210a may be coupled to the third photogate contacts 310a and the fifth photogate contact 320a, and the second photogate 210b may be coupled to the fourth photogate contacts 310b and the sixth photogate contact 320b. The third photogate contacts 310a may be coupled to a conductive line 410a in common, and the fourth photogate contacts 310b may be coupled to a conductive line 410b in common. The fifth photogate contact 320a may be coupled to a conductive line 420a, and the sixth photogate contact 320b may be coupled to a conductive line 420b.

The first photogate 210a may collect photocharges based on the photogate control signals PGS1 and PGS2 received through the third photogate contacts 310a and the fifth photogate contact 320a. The second photogate 210b may collect photocharges based on photogate control signals PGS3 and PGS4 received through the fourth photogate contacts 310b and the sixth photogate contact 320b. The first photogate 210a, the third photogate contacts 310a, the fifth photogate contact 320a, and the conductive lines 410a and 420a shown in FIG. 11 may be identical in structure to the photogate 210, the first photogate contacts 310, the second photogate contact 320, and the conductive lines 410 and 420 shown in FIGS. 1 and 2, respectively. The second photogate 210b, the fourth photogate contacts 310b, the sixth photogate contact 320b, and the conductive lines 410b and 420b may be arranged in the first direction opposite in shape to the first photogate 210a, the third photogate contacts 310a, the sixth photogate contact 320a, and the conductive lines 410a and 420a. In some implementations, the arrangement of the second photogate 210b, the fourth photogate contacts 310b, the sixth photogate contact 320b, and the conductive lines 410b and 420b may be symmetrical about a center of the boundary between the first photoelectric conversion region 110a and the second photoelectric conversion region 110b to the arrangement of the first photogate 210a, the third photogate contacts 310a, the fifth photogate contact 320a, and the conductive lines 410a and 420a.

The first transfer gate 220a may be formed over the semiconductor substrate 100 at one side (e.g., left side) of the first photogate 210a, and the second transfer gate 220b may be formed over the semiconductor substrate 100 at the other side (e.g., right side) of the second photogate 210b. The first transfer gate 220a may transmit photocharges collected by the first photogate 210a to the first floating diffusion region 120a based on a first transfer control signal TS1, and the second transfer gate 220b may transmit photocharges collected by the second photogate 210b to the second floating diffusion region 120b based on a second transfer control signal TS2.

The first readout circuit 500a may output a first pixel signal corresponding to photocharges accumulated in the first floating diffusion region 120a to a first output node OUT1, and the second readout circuit 500b may output a second pixel signal corresponding to photocharges accumulated in the second floating diffusion region 120b to a second output node OUT2. The first readout circuit 500a may include a first reset transistor RX1, a first source follower transistor DX1, and a first selection transistor SX1. The second readout circuit 500b may include a second reset transistor RX2, a second source follower transistor DX2, and a second selection transistor SX2. The first readout circuit 500a and the second readout circuit 500b shown in FIG. 11 may be identical in structure and function to the readout circuit 500a shown in FIGS. 1 and 2.

In the unit pixel (PX) shown in FIG. 11, the first photogate 210a and the second photogate 210b may be periodically turned on, such that each of the first and second photogates 210a and 210b can collect photocharges therein.

The photocharges collected by the first photogate 210a may be transmitted to the first floating diffusion region 120a by the first transfer gate 220a, and the first readout circuit 500a may output a first pixel signal corresponding to the photocharges accumulated in the first floating diffusion region 120a to the output node OUT1. The photocharges collected by the second photogate 210b may be transmitted to the second floating diffusion region 120b by the second transfer gate 220b, and the second readout circuit 500b may output a second pixel signal corresponding to the photocharges accumulated in the second floating diffusion region 120b to the output node OUT2.

The photocharges may be collected using the first photogate 210a and transmitted to the first floating diffusion region 120a using the first transfer gate 220a in the same way as FIGS. 3A to 3C. In addition, the photocharges may be collected using the second photogate 210b and transmitted to the second floating diffusion region 120b using the second transfer gate 220b in the same way as FIGS. 3A to 3C.

The image sensing device including the unit pixels shown in FIG. 11 may measure a delay time of light by comparing the first pixel signal with the second pixel signal for each unit pixel, and may calculate the distance between the image sensing device and a target object to be captured using the measured delay time. In some implementations, more than one structure shown in FIG. 1 can be formed in each unit pixel for the image sensing device to be utilized as a Time Of Flight (TOF) sensing device for calculating the distance between the image sensing device and the target object to be captured.

Figure 12:
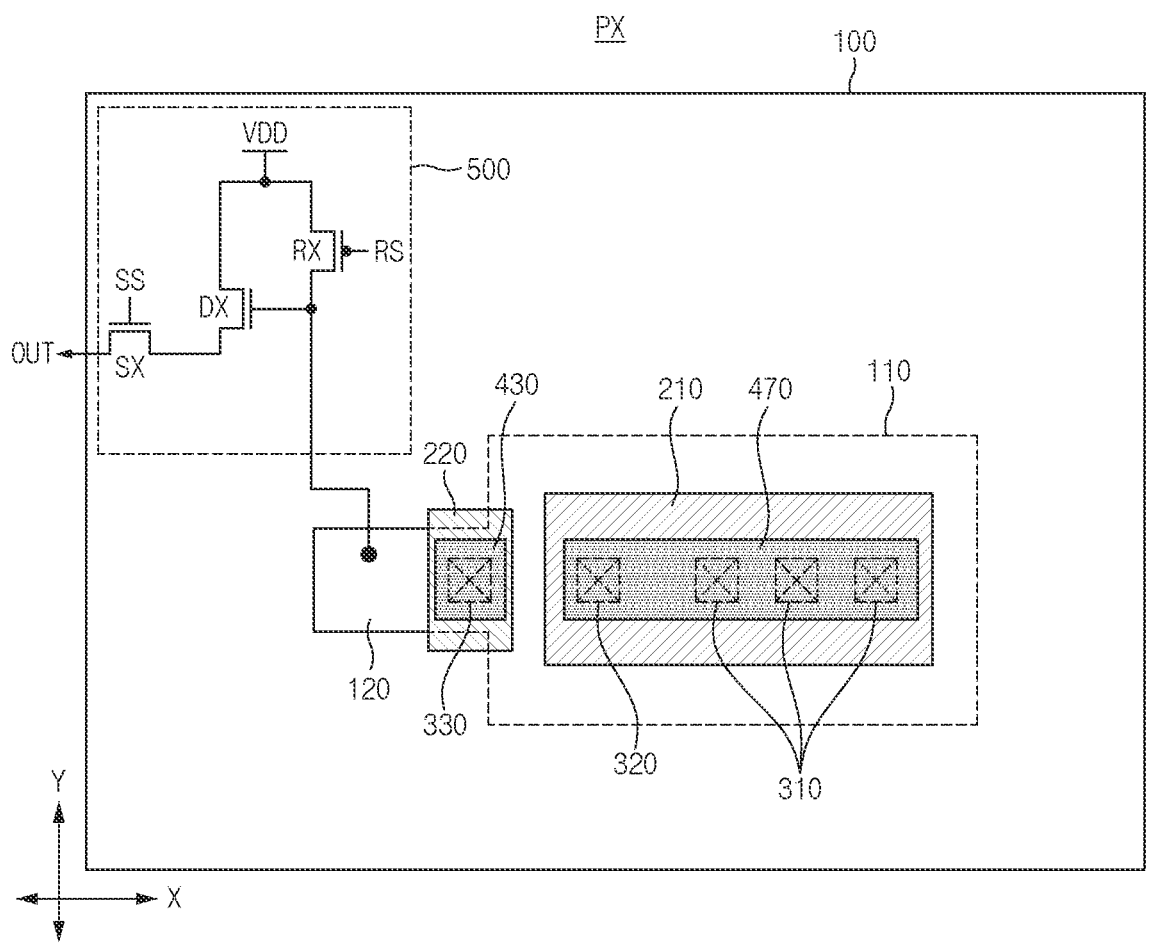
FIG. 12 is a schematic diagram illustrating an example structure of a unit pixel included in an image sensing device based on another embodiment of the disclosed technology.

FIG. 12 is a schematic diagram illustrating an example structure of a unit pixel (PX) included in an image sensing device based on another embodiment of the disclosed technology.

Referring to FIG. 12, the first photogate contacts 310 and the second photogate contact 320 are coupled to the same conductive line 470 in common, unlike what is illustrated in FIG. 1. That is, the first photogate contacts 310 and the second photogate contact 320 shown in FIG. 12 may receive the same photogate control signal.

In some implementations, the bottom end of the second photogate contact 320 is located deeper in the photogate 210 than the first photogate contacts 310, and thus even when the same photogate control signal is applied to the first photogate contacts 310 and the second photogate contact 320, much more photocharges can be collected near a lower portion of the second photogate contact 320, improving the transfer efficiency of the photocharges.

Although a number of illustrative embodiments have been described, it should be understood that variations and modifications of the disclosed embodiments and other embodiments can be devised based on what is described and/or illustrated in this patent document.

What is claimed is:

1. An image sensing device comprising:
   a first photoelectric conversion region structured to generate photocharges based on incident light;
   a first photogate disposed over the first photoelectric conversion region to collect photocharges generated by the first photoelectric conversion region;
   a first transfer gate disposed at one side of the first photogate to transmit the photocharges collected by the first photogate to a first floating diffusion region;
   a first photogate contact coupled to a first region of the first photogate; and
   a second photogate contact coupled to a second region of the first photogate that is located closer to the first transfer gate than the first region in the first photogate,
   wherein the second region is more deeply etched than the first region.

2. The image sensing device according to claim 1, wherein:
   the second photogate contact is located closer to the first photoelectric conversion region than the first photogate contact.

3. The image sensing device according to claim 1, wherein:
   the second photogate contact includes a bottom end that is located at a deeper depth in the first photogate than a bottom end of the first photogate contact.

4. The image sensing device according to claim 1, wherein:
   the first photogate contact is coupled to a first conductive line to receive a first photogate control signal at a first time point; and
   the second photogate contact is coupled to a second conductive line to receive a second photogate control signal at a second time point later than the first time point.

5. The image sensing device according to claim 1, wherein the first photogate contact includes:
   a plurality of photogate contacts coupled to a same conductive line in common to simultaneously receive a same photogate control signal.

6. The image sensing device according to claim 5, wherein:
   the first photogate contact and the second photogate contact are arranged in a row in a first direction.

7. The image sensing device according to claim 1, wherein the first photogate contact includes:
   a plurality of photogate contacts coupled to different conductive lines to receive different photogate control signals, respectively.

8. The image sensing device according to claim 7, wherein:
   the closer to the first transfer gate the plurality of photogate contacts is located, the deeper bottom ends of the photogate contacts are located in the first photogate.

9. The image sensing device according to claim 7, wherein:

the photogate contacts respectively receive the photogate control signals at different time points.

10. The image sensing device according to claim 9, wherein:
the closer to the first transfer gate the photogate contacts are located, the later the photogate contacts receive the photogate control signals.

11. The image sensing device according to claim 1, wherein the second photogate contact includes:
a plurality of photogate contacts coupled in common to a same conductive line to simultaneously receive a same photogate control signal.

12. The image sensing device according to claim 11, wherein:
the first photogate contact includes a plurality of photogate contacts arranged in a row in a first direction; and
the second photogate contact includes a plurality of photogate contacts arranged in a row in a second direction perpendicular to the first direction.

13. The image sensing device according to claim 1, wherein:
the first photogate contact and the second photogate contact are coupled in common to a same conductive line to simultaneously receive a same photogate control signal.

14. The image sensing device according to claim 1, wherein the photoelectric conversion region includes:
a first charge collection region disposed below the first region, and configured to collect photocharges by a first photogate control signal applied to the first photogate contact; and
a second charge collection region disposed below the second region, and configured to allow the photocharges collected in the first charge collection region to move by a second photogate control signal applied to the second photogate contact.

15. The image sensing device according to claim 1, wherein:
the first region is formed in a rectangular shape in which a width in a first direction is longer than a width in a second direction perpendicular to the first direction; and
the second region is formed in a rectangular shape in which a width in the second direction is longer than a width in the first direction.

16. The image sensing device according to claim 1, further comprising:
a first readout circuit configured to output a first pixel signal corresponding to photocharges accumulated in the first floating diffusion region.

17. The image sensing device according to claim 1, further comprising:
a second photoelectric conversion region located adjacent to the first photoelectric conversion region within a same unit pixel, and configured to generate photocharges by converting the incident light;
a second photogate disposed over the second photoelectric conversion region, and configured to collect the photocharges generated by the second photoelectric conversion region;
a second transfer gate disposed at one side of the second photogate, and configured to transmit the photocharges collected by the second photogate to a second floating diffusion region;
a third photogate contact coupled to a first region of the second photogate; and
a fourth photogate contact coupled to a second region of the second photogate that is located closer to the second transfer gate than the first region in the second photogate.

18. The image sensing device according to claim 17, wherein:
the first transfer gate and the second transfer gate are located opposite to each other with respect to the first and second photogates.

19. The image sensing device according to claim 17, further comprising:
a second readout circuit configured to output a second pixel signal corresponding to photocharges accumulated in the second floating diffusion region.

* * * * *